(12) United States Patent
Yamazaki

(10) Patent No.: US 6,720,767 B2
(45) Date of Patent: Apr. 13, 2004

(54) MRI APPARATUS

(75) Inventor: Aki Yamazaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/346,319

(22) Filed: Jan. 17, 2003

(65) Prior Publication Data

US 2003/0137298 A1 Jul. 24, 2003

(30) Foreign Application Priority Data

Jan. 23, 2002 (JP) ....................................... 2002-014286

(51) Int. Cl.$^7$ ................................................ G01V 3/00
(52) U.S. Cl. .................................... 324/309; 324/307
(58) Field of Search ................................ 324/309, 318, 324/307, 306, 312, 314, 300

(56) References Cited

U.S. PATENT DOCUMENTS

| | | | |
|---|---|---|---|
| 5,148,109 A | 9/1992 | Takane et al. | 324/309 |
| 6,127,825 A * | 10/2000 | Goto | 324/307 |
| 6,218,834 B1 * | 4/2001 | Goto | 324/307 |
| 6,341,179 B1 | 1/2002 | Stoyle et al. | 382/254 |
| 6,472,873 B2 | 10/2002 | Yamazaki | 324/318 |
| 6,489,764 B2 | 12/2002 | Yamazaki et al. | 324/307 |
| 6,498,485 B2 | 12/2002 | Miyosi et al. | 324/307 |

* cited by examiner

*Primary Examiner*—Brij Shrivastav
(74) *Attorney, Agent, or Firm*—Carl B. Horton, Esq.; Armstrong Teasdale LLP

(57) ABSTRACT

For the purpose of obtaining an image without band artifacts, in a pulse sequence for conducting data collection in an SSFP state, the phase of an RF pulse α is adjusted to correct the zeroth-order phase offsets of an FID signal and SE/STE signals and a correction pulse for correcting the first-order phase offsets of the FID signal and the SE/STE signals are incorporated into a read axis pulse.

5 Claims, 13 Drawing Sheets

100
MRI apparatus

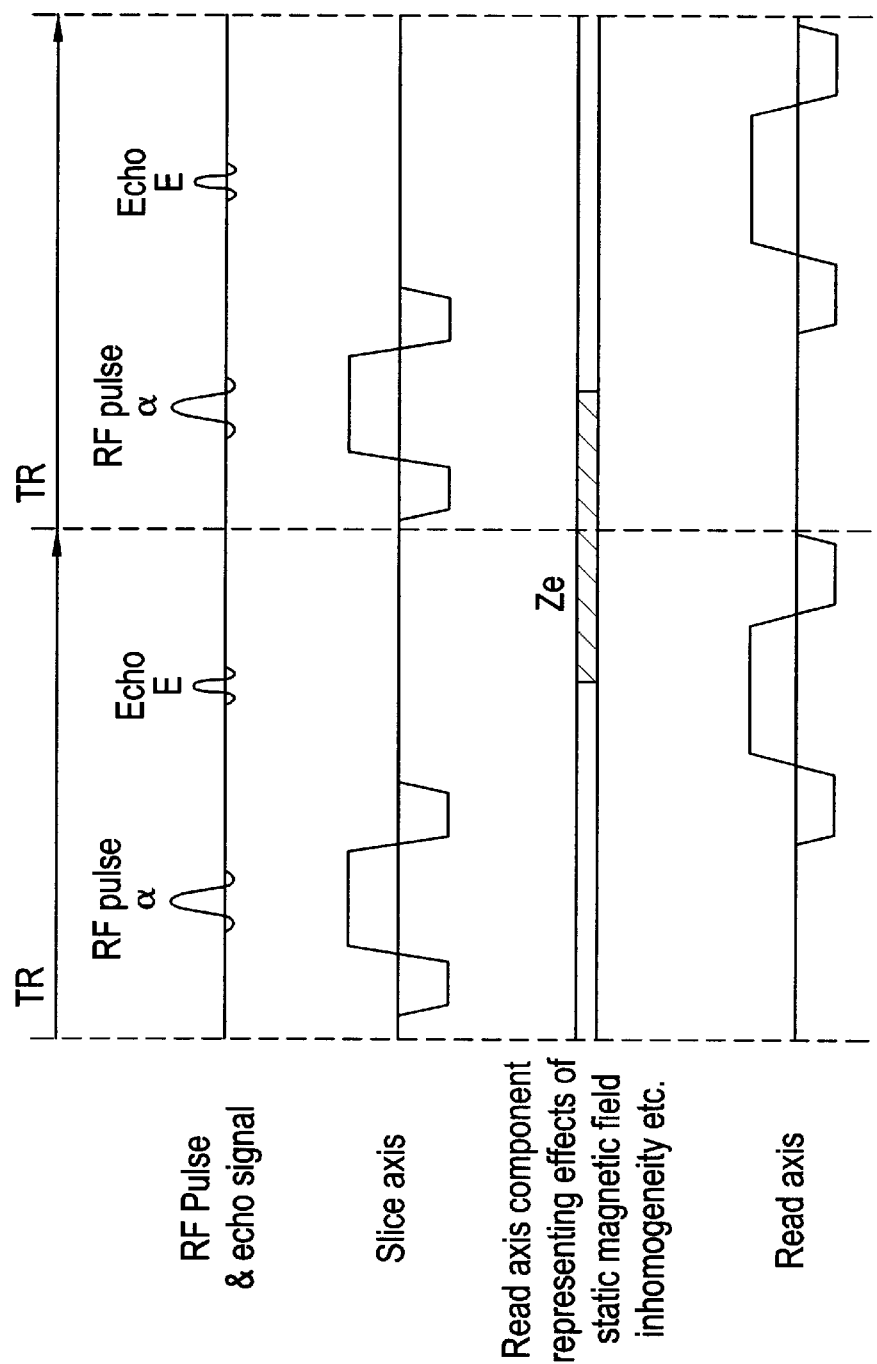

RF pulse
α

Read axis pulse

Correction pulse
h

Correction pulse
h

MRI APPARATUS

CROSS REFERENCE TO RELATED APPLICATIONS

This application claims the benefit of Japanese Application No. 2002-014286 filed Jan. 23, 2002.

BACKGROUND OF THE INVENTION

The present invention relates to a method of measuring the phase offset of an FID (free induction decay) signal, a method of measuring the phase offset of SE (spin echo)/STE (stimulated echo) signals, an MR (magnetic resonance) imaging method, and an MRI (magnetic resonance imaging) apparatus, and more particularly to a method of measuring the phase offset of an FID signal caused by static magnetic field inhomogeneity, a method of measuring the phase offset of SE/STE signals (SE signal and STE signal) caused by static magnetic field inhomogeneity, an MR imaging method in which the phase offset of the FID signal and the phase offset of the SE/STE signals caused by static magnetic field inhomogeneity are corrected, and an MRI apparatus capable of conducting such methods.

Japanese Patent No. 2,898,329 discloses an MR imaging method comprising:

(1) repeatedly conducting data collection in an SSFP (steady state free precession) state with a successively varying amount of phase encoding to acquire data $fv(0)$ for individual views v that together fill a k-space;

(2) repeatedly conducting data collection in the SSFP state with the successively varying amount of phase encoding and with an RF phase alternated by 180° to acquire data $fv(1)$ for individual views v that together fill the k-space;

(3) generating data Av by addition processing or subtraction processing on $fv(0)$ and $fv(1)$ as given by:

$$Av=0.5\times Fv(0)+0.5\times Fv(1)$$

or $$Av=0.5\times Fv(0)-0.5\times Fv(1); \text{ and}$$

(4) reconstructing an image from the resulting data Av.

The data collected in the SSFP state as in the MR imaging method above contain both components of FID signals and components of SE/STE signals.

It is known that when an image is produced from data collected in the SSFP state as in the MR imaging method disclosed in Japanese Patent No. 2,898,329, static magnetic field inhomogeneity, if any, gives rise to band artifacts in the image.

The generation of band artifacts is caused by phase offsets in the FID signals and SE/STE signals due to static magnetic field inhomogeneity, which results in mutual interference between the FID and SE/STE signals.

SUMMARY OF THE INVENTION

It is therefore an object of the present invention is to provide a method of measuring the phase offset of an FID signal caused by static magnetic field inhomogeneity, a method of measuring the phase offset of SE/STE signals caused by static magnetic field inhomogeneity, an MR imaging method in which the phase offset of the FID signal and the phase offset of the SE/STE signals caused by static magnetic field inhomogeneity are corrected, and an MRI apparatus capable of conducting such methods.

In accordance with a first aspect, the present invention provides a method of measuring the phase offset of an FID signal characterized in comprising: adding a crusher for resetting the phase of SE/STE signals to a pulse sequence that is repeated for conducting data collection in an SSFP state, and omitting a phase encoding axis pulse therefrom; collecting phase-offset-measurement data in the SSFP state by repeating the resulting pulse sequence; and measuring the phase offset of the FID signal from the phase-offset-measurement data obtained.

In the method of measuring the phase offset of an FID signal of the first aspect, since the phase of the SE/STE signals is reset by adding a crusher, the phase-offset-measurement data obtained exhibits the phase offset of the FID signal component. Therefore, the phase offset of the FID signal can be measured from the phase-offset-measurement data obtained.

In accordance with a second aspect, the present invention provides the method of measuring the phase offset of an FID signal having the aforementioned configuration, characterized in that: said crusher for resetting the phase of SE/STE signals is a gradient pulse that is applied to at least one of a phase encoding axis and a read axis at a time after a data collection period.

In the method of measuring the phase offset of an FID signal of the second aspect, since a gradient pulse is applied to at least one of a phase encoding axis and a read axis at a time after a data collection period, the phase of the SE/STE signals can be reset without affecting the phase of the FID signal component.

In accordance with a third aspect, the present invention provides a method of measuring the phase offset of SE/STE signals characterized in comprising: adding a crusher for resetting the phase of an FID signal to a pulse sequence that is repeated for conducting data collection in an SSFP state, and omitting a phase encoding axis pulse therefrom; collecting phase-offset-measurement data in the SSFP state by repeating the resulting pulse sequence; and measuring the phase offset of the SE/STE signals from the phase-offset-measurement data obtained.

In the method of measuring the phase offset of FID signal of the third aspect, since the phase of the FID signal is reset by adding a crusher, the phase-offset-measurement data obtained exhibits the phase offset of the SE/STE signal component. Therefore, the phase offset of the SE/STE signals can be measured from the phase-offset-measurement data obtained.

In accordance with a fourth aspect, the present invention provides the method of measuring the phase offset of SE/STE signals having the aforementioned configuration, characterized in that: said crusher for resetting the phase of an FID signal is a gradient pulse that is applied to at least one of a phase encoding axis and a read axis at a time after an RF pulse and before a data collection period.

In the method of measuring the phase offset of an FID signal of the fourth aspect, since a gradient pulse is applied to at least one of a phase encoding axis and a read axis at a time after an RF pulse and before a data collection period, the phase of the FID signal can be reset without affecting the phase of the SE/STE signal component.

In accordance with a fifth aspect, the present invention provides an MR imaging method characterized in comprising: adjusting the phase of an RF pulse in a pulse sequence that is repeated for conducting data collection in an SSFP state to correct the phase offsets of an FID signal and SE/STE signals; collecting imaging data in the SSFP state by repeating the resulting pulse sequence; and producing an image from the imaging data obtained.

In the MR imaging method of the fifth aspect, since the zeroth-order phase offsets of the FID signal and SE/STE signals can be corrected by adjusting the phase of the RF pulse, band artifacts caused by static magnetic field inhomogeneity can be reduced.

In accordance with a sixth aspect, the present invention provides an MR imaging method characterized in comprising: adding a correction pulse for correcting the phase offsets of an FID signal and SE/STE signals to a pulse sequence that is repeated for conducting data collection in an SSFP state; collecting imaging data in the SSFP state by repeating the resulting pulse sequence; and producing an image from the imaging data obtained.

In the MR imaging method of the sixth aspect, since the first-order phase offsets of the FID signal and SE/STE signals can be corrected by adding a correction pulse, band artifacts caused by static magnetic field inhomogeneity can be reduced.

In accordance with a seventh aspect, the present invention provides an MR imaging method characterized in comprising: adjusting the phase of an RF pulse in a pulse sequence that is repeated for conducting data collection in an SSFP state and adding a correction pulse for correcting the phase offsets of an FID signal and SE/STE signals to correct the phase offsets of the FID signal and SE/STE signals; collecting imaging data in the SSFP state by repeating the resulting pulse sequence; and producing an image from the imaging data obtained.

In the MR imaging method of the seventh aspect, since the zero-th order and first-order phase offsets of the FID signal and SE/STE signals can be corrected by adjusting the phase of the RF pulse and adding a correction pulse, band artifacts caused by static magnetic field inhomogeneity can be reduced.

In accordance with an eighth aspect, the present invention provides the MR imaging method having the aforementioned configuration, characterized in that: said correction pulse is incorporated into a read axis pulse.

Although the correction pulse may be separately applied, it can be incorporated into a read axis pulse.

In accordance with a ninth aspect, the present invention provides an MRI apparatus comprising a transmit coil for transmitting an RF pulse, a gradient coil for applying a gradient magnetic field, a receive coil for receiving an NMR signal, scanning means for driving said transmit coil, gradient coil and receive coil to collect data, and data processing means for arithmetically processing the collected data to produce an image, said MRI apparatus characterized in comprising: phase offset measuring means for adding a crusher for resetting the phase of SE/STE signals to a pulse sequence that is repeated for conducting data collection in an SSFP state, and omitting a phase encoding axis pulse therefrom, collecting phase-offset-measurement data in the SSFP state by repeating the resulting pulse sequence, and measuring the phase offset of the FID signal from the phase-offset-measurement data obtained.

In the MRI apparatus of the ninth aspect, the method of measuring the phase of an FID signal as described regarding the first aspect can be suitably implemented.

In accordance with a tenth aspect, the present invention provides the MRI apparatus having the aforementioned configuration, characterized in that: said crusher for resetting the phase of SE/STE signals is a gradient pulse that is applied to at least one of a phase encoding axis and a read axis at a time after a data collection period.

In the MRI apparatus of the tenth aspect, the method of measuring the phase of an FID signal as described regarding the second aspect can be suitably implemented.

In accordance with an eleventh aspect, the present invention provides an MRI apparatus comprising a transmit coil for transmitting an RF pulse, a gradient coil for applying a gradient magnetic field, a receive coil for receiving an NMR signal, scanning means for driving said transmit coil, gradient coil and receive coil to collect data, and data processing means for arithmetically processing the collected data to produce an image, said MRI apparatus characterized in comprising: phase offset measuring means for adding a crusher for resetting the phase of an FID signal to a pulse sequence that is repeated for conducting data collection in an SSFP state, and omitting a phase encoding axis pulse therefrom, collecting phase-offset-measurement data in the SSFP state by repeating the resulting pulse sequence, and measuring the phase offset of the SE/STE signals from the phase-offset-measurement data obtained.

In the MRI apparatus of the eleventh aspect, the method of measuring the phase of SE/STE signals as described regarding the third aspect can be suitably implemented.

In accordance with a twelfth aspect, the present invention provides the MRI apparatus having the aforementioned configuration, characterized in that: said crusher for resetting the phase of an FID signal is a gradient pulse that is applied to at least one of a phase encoding axis and a read axis at a time after an RF pulse and before a data collection period.

In the MRI apparatus of the twelfth aspect, the method of measuring the phase of SE/STE signals as described regarding the fourth aspect can be suitably implemented.

In accordance with a thirteenth aspect, the present invention provides an MRI apparatus comprising a transmit coil for transmitting an RF pulse, a gradient coil for applying a gradient magnetic field, a receive coil for receiving an NMR signal, scanning means for driving said transmit coil, gradient coil and receive coil to collect data, and data processing means for arithmetically processing the collected data to produce an image, said MRI apparatus characterized in that: said scanning means adjusts the phase of an RF pulse in a pulse sequence that is repeated for conducting data collection in an SSFP state to correct the phase offsets of an FID signal and SE/STE signals, and collects imaging data in the SSFP state by repeating the resulting pulse sequence.

In the MRI apparatus of the thirteenth aspect, the MR imaging method as described regarding the fifth aspect can be suitably implemented.

In accordance with a fourteenth aspect, the present invention provides an MRI apparatus comprising a transmit coil for transmitting an RF pulse, a gradient coil for applying a gradient magnetic field, a receive coil for receiving an NMR signal, scanning means for driving said transmit coil, gradient coil and receive coil to collect data, and data processing means for arithmetically processing the collected data to produce an image, said MRI apparatus characterized in that: said scanning means adds a correction pulse for correcting the phase offsets of an FID signal and SE/STE signals to a pulse sequence that is repeated for conducting data collection in an SSFP state, and collects imaging data in the SSFP state by repeating the resulting pulse sequence.

In the MRI apparatus of the fourteenth aspect, the MR imaging method as described regarding the sixth aspect can be suitably implemented.

In accordance with a fifteenth aspect, the present invention provides an MRI apparatus comprising a transmit coil for transmitting an RF pulse, a gradient coil for applying a gradient magnetic field, a receive coil for receiving an NMR signal, scanning means for driving said transmit coil, gradient coil and receive coil to collect data, and data processing means for arithmetically processing the collected data to produce an image, said MRI apparatus characterized in that: said scanning means adjusts the phase of an RF pulse in a pulse sequence that is repeated for conducting data collection in an SSFP state and adds a correction pulse for correcting the phase offsets of an FID signal and SE/STE signals to correct the phase offsets of the FID signal and SE/STE signals, and collects imaging data in the SSFP state by repeating the resulting pulse sequence.

In the MRI apparatus of the fifteenth aspect, the MR imaging method as described regarding the seventh aspect can be suitably implemented.

In accordance with a sixteenth aspect, the present invention provides the MRI apparatus having the aforementioned configuration, characterized in that: said correction pulse is incorporated into a read axis pulse.

In the MRI apparatus of the sixteenth aspect, the MR imaging method as described regarding the eighth aspect can be suitably implemented.

According to the MR imaging method and MRI apparatus of the present invention, it is possible to obtain an image of good image quality without band artifacts.

Further objects and advantages of the present invention will be apparent from the following description of the preferred embodiments of the invention as illustrated in the accompanying drawings.

BRIEF DESCRIPTION OF THE DRAWINGS

FIG. 11 is a schematic representation for explaining the phase offset of the SE/STE signals.

DETAILED DESCRIPTION OF THE INVENTION

The present invention will now be described in detail with reference to embodiments shown in the accompanying drawings.

Figure 1:
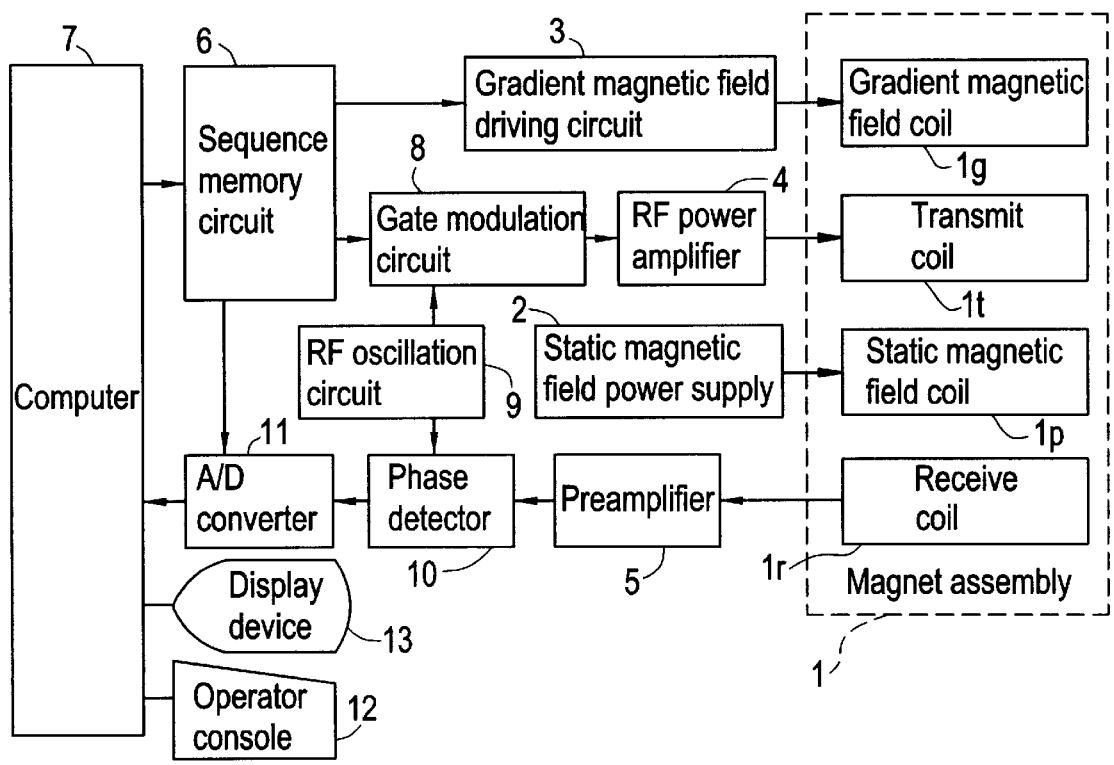
FIG. 1 is a block diagram of an MRI apparatus in accordance with one embodiment of the present invention.

FIG. 1 is a block diagram showing an MRI apparatus in accordance with one embodiment of the present invention.

In the MRI apparatus 100, a magnet assembly 1 has a cavity portion (bore) for inserting therein a subject, and is provided with a static magnetic field coil $1p$ for applying a constant static magnetic field to the subject, a gradient magnetic field coil $1g$ for generating X-axis, Y-axis and Z-axis gradient magnetic fields (a slice axis, a read axis and a phase encoding axis are formed by the combination of X-, Y-, and Z-axes), a transmit coil $1t$ for supplying RF pulses for exciting spins of atomic nuclei within the subject, and a receive coil $1r$ for detecting NMR signals from the subject, these components being disposed surrounding the cavity portion. The static magnetic field coil $1p$, gradient magnetic field coil $1g$, transmit coil $1t$, and receive coil $1r$ are connected to a static magnetic field power supply 2, a gradient magnetic field driving circuit 3, an RF power amplifier 4, and a preamplifier 5, respectively.

It should be noted that a permanent magnet may be employed in place of the static magnetic field coil $1p$.

A sequence memory circuit 6 operates the gradient magnetic field driving circuit 3 based on a stored pulse sequence in response to instructions from a computer 7 to thereby generate the gradient magnetic fields from the gradient magnetic field coil $1g$ in the magnet assembly 1. The sequence memory circuit 6 also operates a gate modulation circuit 8 to modulate a carrier output signal from an RF oscillation circuit 9 into a pulsed signal of predefined timing and envelope shape. The pulsed signal is applied to the RF power amplifier 4 as an RF pulse, power-amplified in the RF power amplifier 4, and then applied to the transmit coil $1t$ in the magnet assembly 1 to selectively excite a desired imaging plane.

The preamplifier 5 amplifies an NMR signal from the subject received at the receive coil $1r$ in the magnet assembly 1, and inputs the signal to a phase detector 10. The phase detector 10 phase-detects the NMR signal from the preamplifier 5 employing the carrier output signal from the RF oscillation circuit 9 as a reference signal, and supplies the phase-detected signal to an A/D converter 11. The A/D converter 11 converts the phase-detected analog signal into digital data, and inputs it to the computer 7.

The computer 7 is responsible for overall control such as receiving information supplied from an operator console 12. The computer 7 also reads the digital data from the A/D converter 11, and performs arithmetic processing to produce an image.

A display device 13 displays the image and messages.

Figure 2:
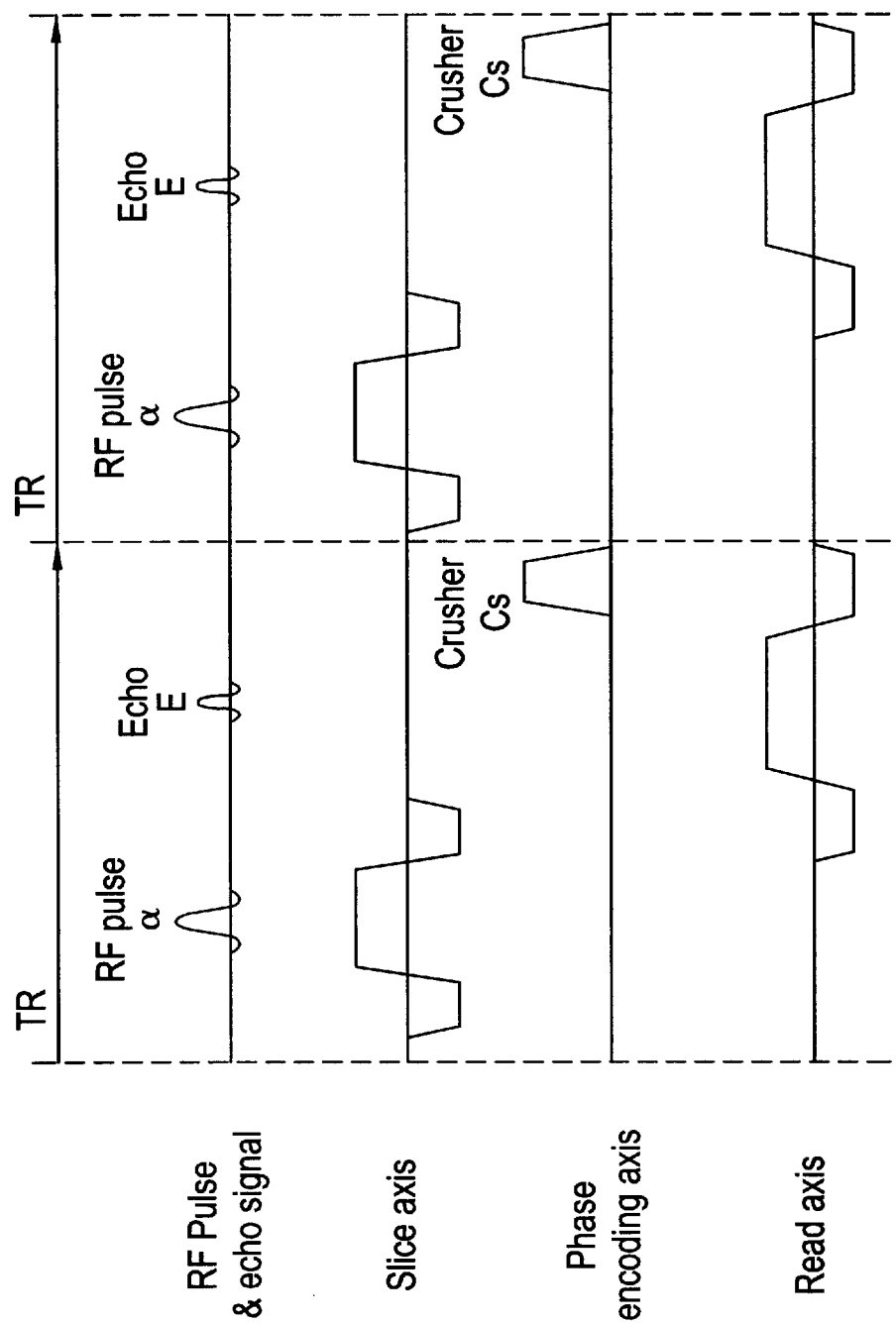
FIG. 2 is a pulse sequence chart showing a first example of a pulse sequence for measuring the phase offset of an FID signal.

FIG. 2 is a pulse sequence chart showing a first example of a pulse sequence for measuring the phase offset of an FID signal. Although two TR's are shown in FIG. 2, the pulse sequence is repeated until the SSFP state is reached.

The pulse sequence for measuring the phase offset of an FID signal is obtained by adding a crusher Cs for resetting the phase of the SE/STE signals to a pulse sequence that is repeated for conducting data collection in the SSFP state, and omitting a phase encoding axis pulse therefrom.

The crusher Cs for resetting the phase of the SE/STE signals is applied to the phase encoding axis at a time after the data collection period.

Figure 3:
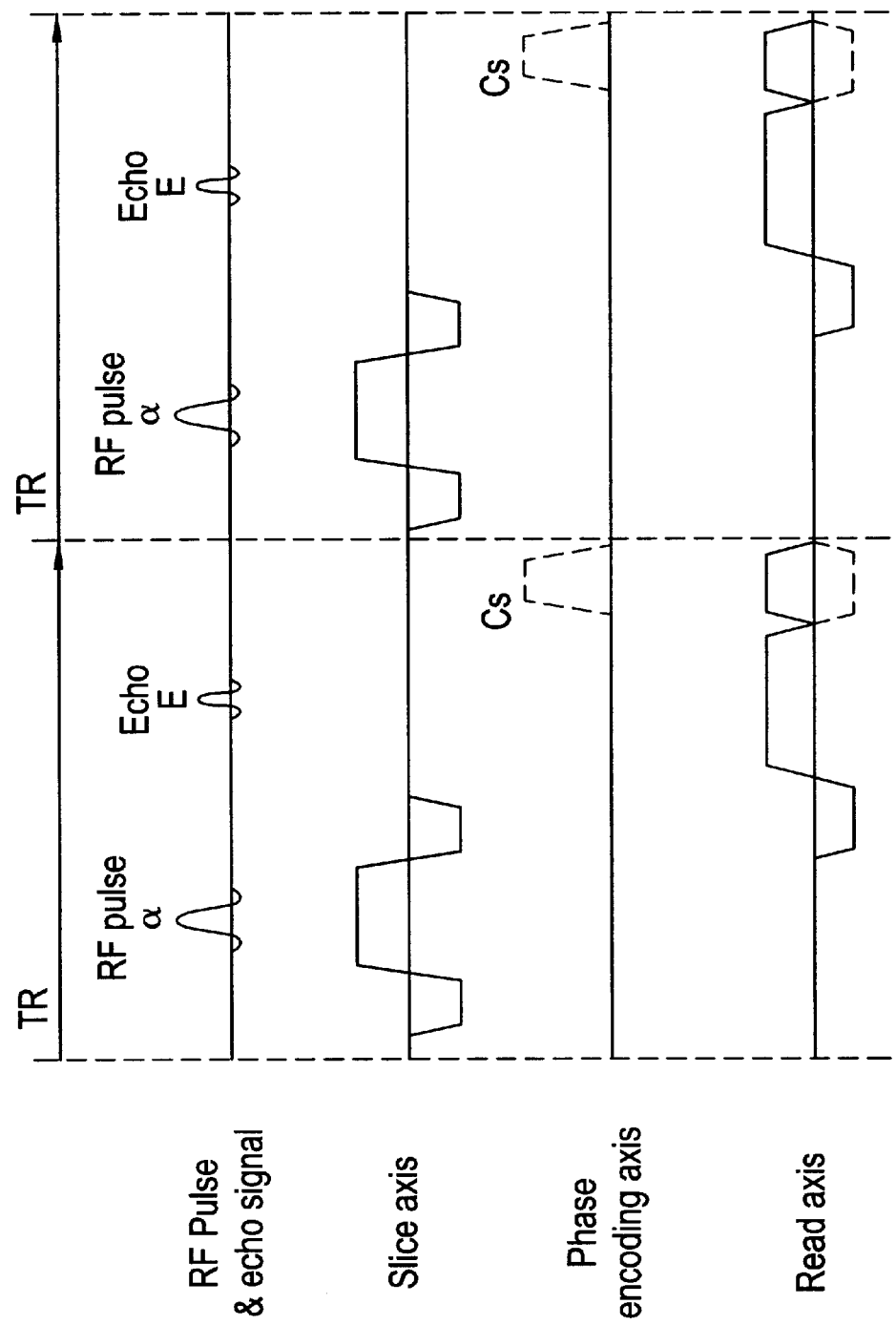
FIG. 3 is a pulse sequence chart showing a second example of a pulse sequence for measuring the phase offset of an FID signal.

FIG. 3 is a pulse sequence chart showing a second example of a pulse sequence for measuring the phase offset of an FID signal. Although two TR's are shown in FIG. 3, the pulse sequence is repeated until the SSFP state is reached.

The pulse sequence for measuring the phase offset of an FID signal is obtained by incorporating a crusher Cs for resetting the phase of the SE/STE signals into a read axis pulse of the pulse sequence that is repeated for conducting data collection in the SSFP state, and omitting a phase encoding axis pulse therefrom.

The crusher Cs for resetting the phase of the SE/STE signals is applied to the phase encoding axis at a time after the data collection period.

Figure 4:
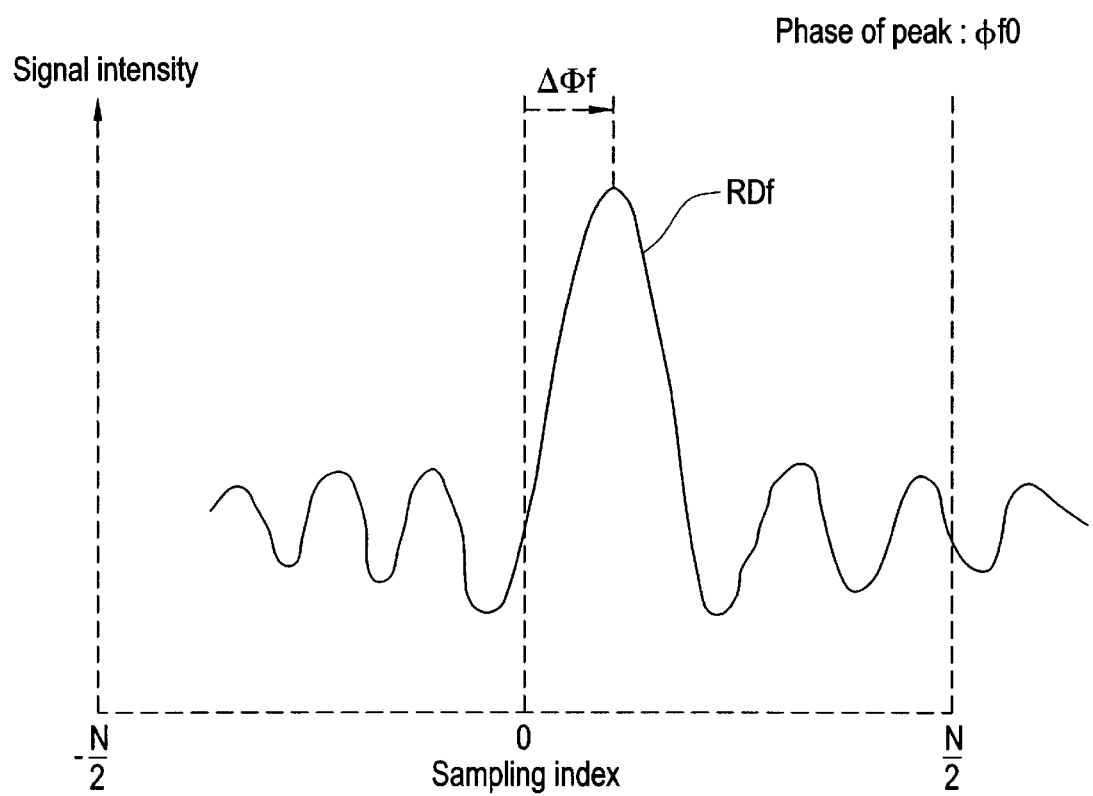
FIG. 4 is a conceptual representation showing the zeroth-order phase offset of the FID signal.

FIG. 4, is a conceptual representation showing raw data RDƒ collected with the pulse sequence for measuring the phase offset of an FID signal.

Absent static magnetic field inhomogeneity, the signal intensity reaches a peak at a sampling index of zero; however, the peak of the signal intensity occurs offset from the sampling index of zero if static magnetic field inhomogeneity is present. The first-order phase offset $\Delta\Phi f$ of the FID signal can be measured from the offset.

Figure 5:
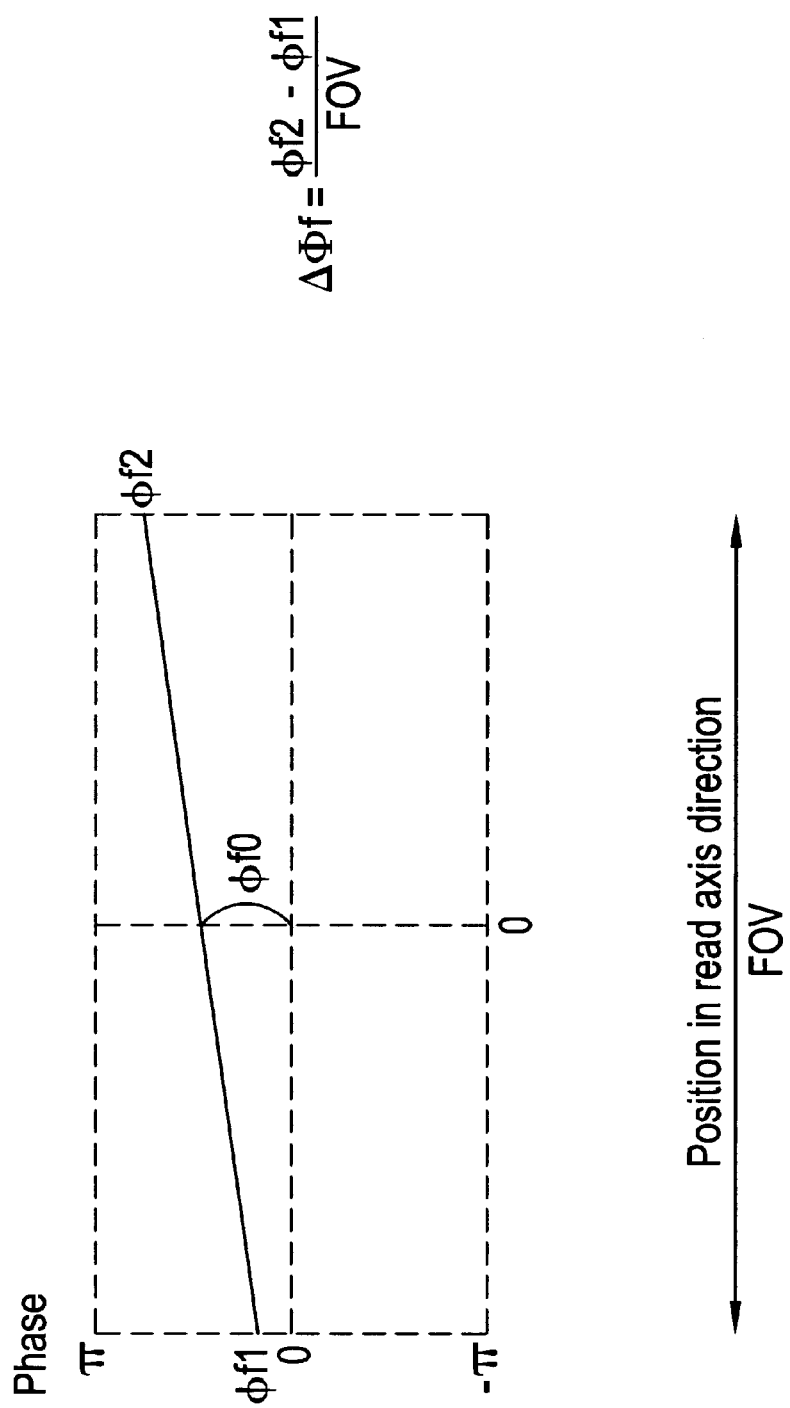
FIG. 5 is a conceptual representation showing the first-order phase offset of the FID signal.

FIG. 5 is a conceptual representation showing the phase of an image that is obtained by Fourier-transforming the raw data RDƒ collected with the pulse sequence for measuring the phase offset of an FID signal.

Absent static magnetic field inhomogeneity, the phase is zero regardless of position; however, the phase is not zero and often exhibits position-dependent variation when static magnetic field inhomogeneity is present. This position-dependent variation of the phase enables measurement of the first-order phase offset $\Delta\Phi f$ of the FID signal. Moreover, the zeroth-order phase offset $\phi f0$ of the FID signal can also be measured.

Figure 6:
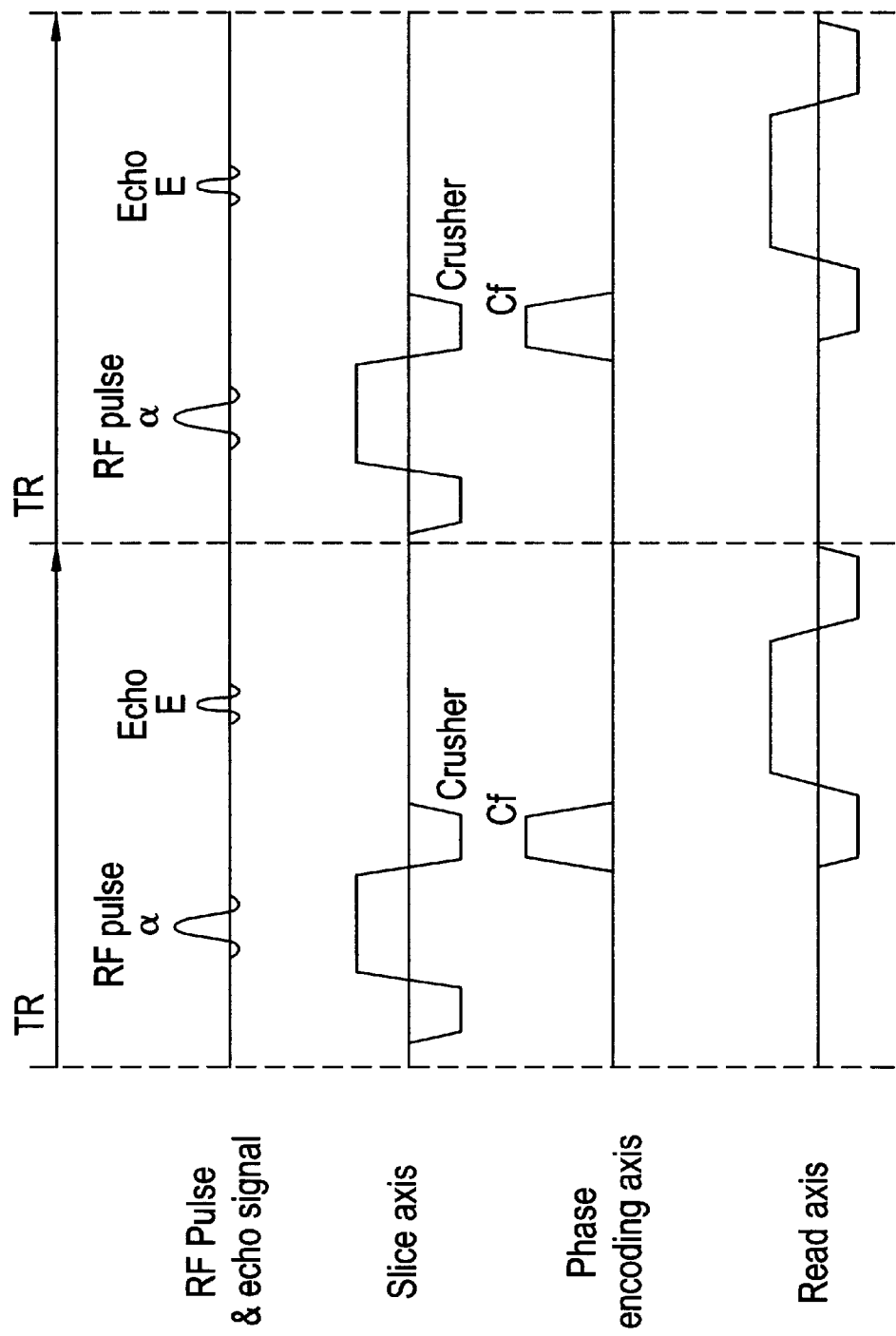
FIG. 6 is a pulse sequence chart showing a first example of a pulse sequence for measuring the phase offset of SE/STE signals.

FIG. 6 is a pulse sequence chart showing a first example of a pulse sequence for measuring the phase offset of SE/STE signals. Although two TR's are shown in FIG. 6, the pulse sequence is repeated until the SSFP state is reached.

The pulse sequence for measuring the phase offset of SE/STE signals is obtained by adding a crusher Cƒ for resetting the phase of the FID signal to a pulse sequence that is repeated for conducting data collection in the SSFP state, and omitting a phase encoding axis pulse therefrom.

The crusher Cƒ for resetting the phase of the FID signal is applied to the phase encoding axis at a time after an RF pulse α and before the data collection period.

Figure 7:
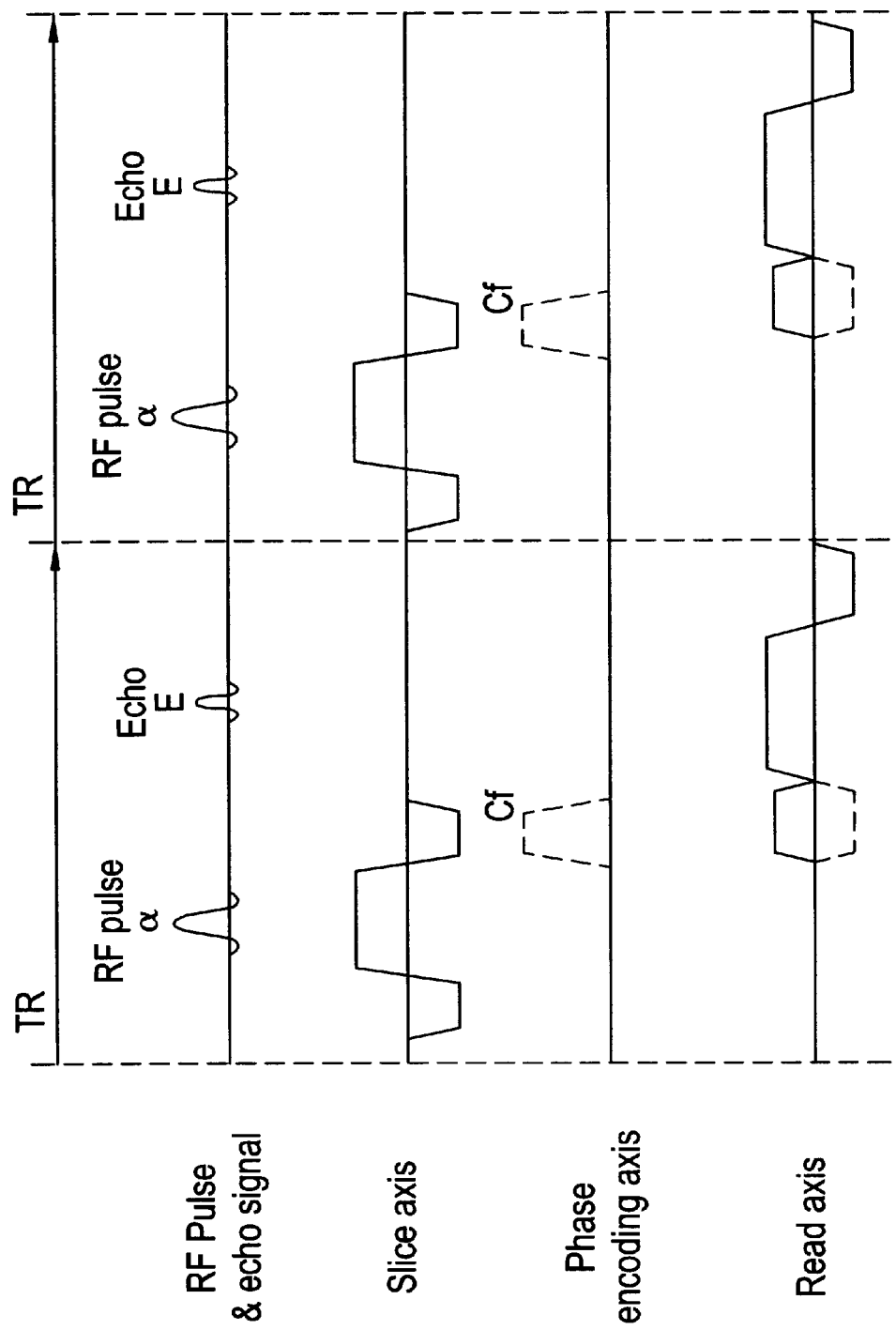
FIG. 7 is a pulse sequence chart showing a second example of a pulse sequence for measuring the phase offset of SE/STE signals.

FIG. 7 is a pulse sequence chart showing a second example of a pulse sequence for measuring the phase offset of SE/STE signals. Although two TR's are shown in FIG. 7, the pulse sequence is repeated until the SSFP state is reached.

The pulse sequence for measuring the phase offset of SE/STE signals is obtained by incorporating a crusher Cƒ for resetting the phase of the FID signal into the read axis pulse of the pulse sequence that is repeated for conducting data collection in the SSFP state, and omitting a phase encoding axis pulse therefrom.

The crusher Cƒ for resetting the phase of the FID signal is applied to the phase encoding axis at a time after an RF pulse α and before the data collection period.

Figure 8:
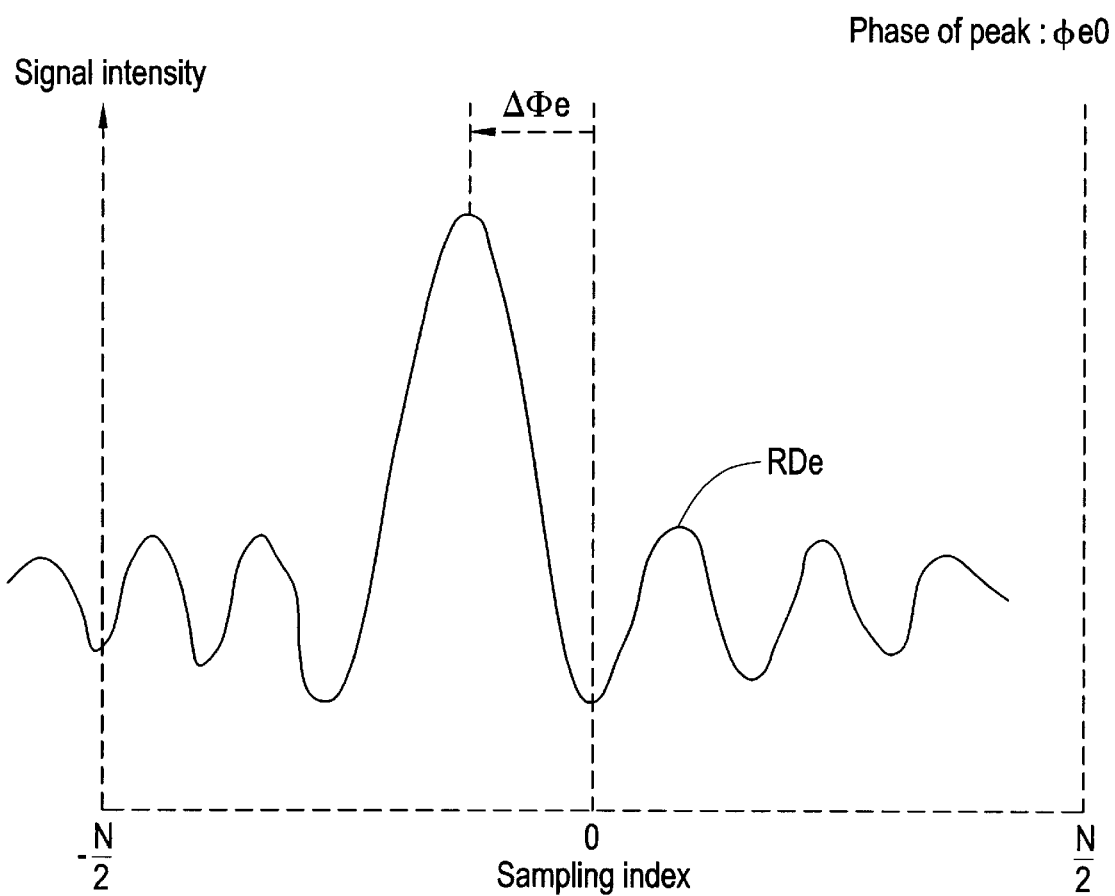
FIG. 8 is a conceptual representation showing the zeroth-order phase offset of the SE/STE signals.

FIG. 8 is a conceptual representation showing raw data RDe collected with the pulse sequence for measuring the phase offset of SE/STE signals.

Absent static magnetic field inhomogeneity, the signal intensity reaches a peak at a sampling index of zero; however, the peak of the signal intensity occurs offset from the sampling index of zero if static magnetic field inhomogeneity is present. The first-order phase offset $\Delta\Phi e$ of the SE/STE signals can be measured from the offset.

Figure 9:
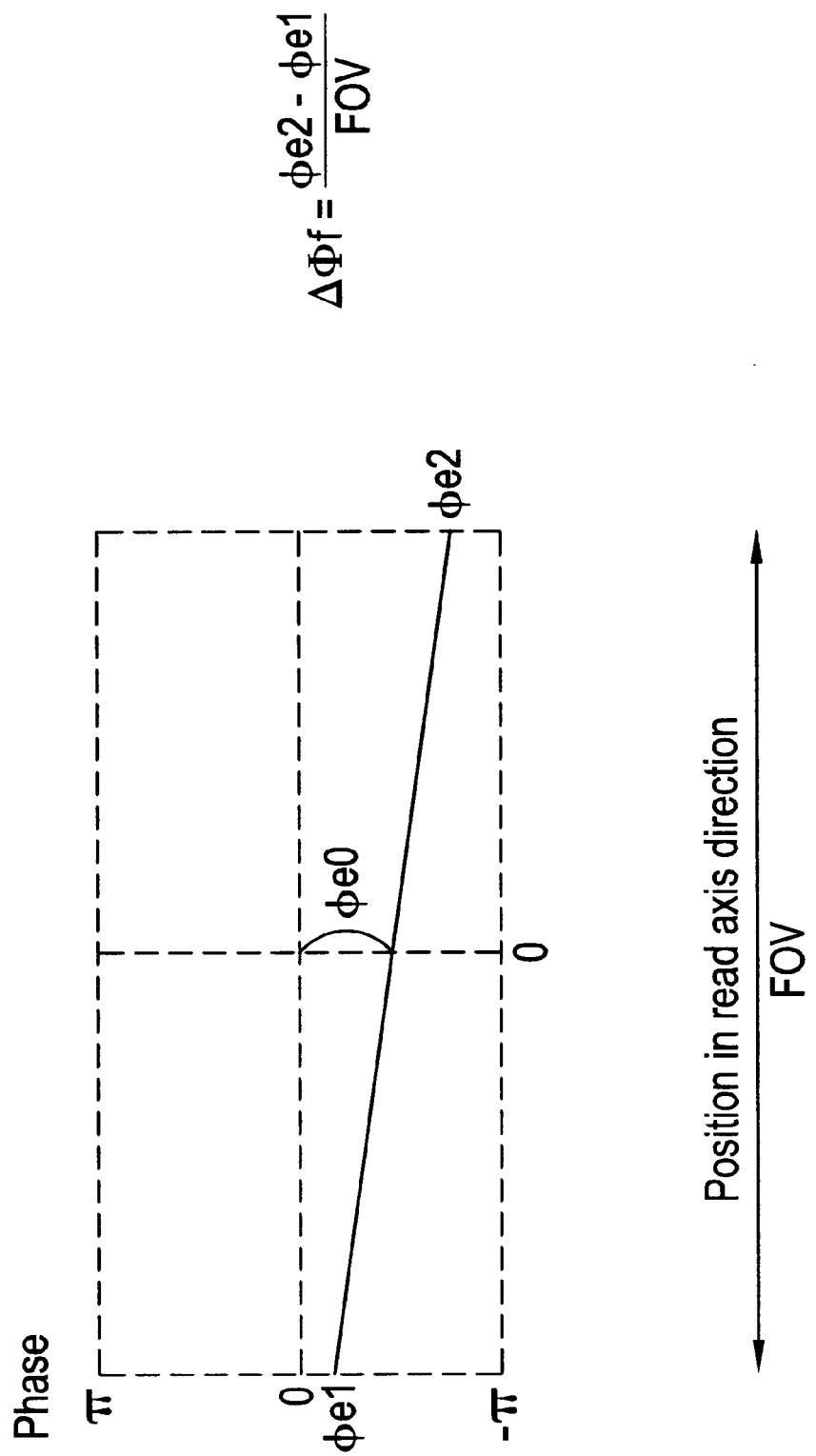
FIG. 9 is a conceptual representation showing the first-order phase offset of the SE/STE signals.

FIG. 9 is a conceptual representation showing the phase of an image that is obtained by Fourier-transforming the raw data RDe collected with the pulse sequence for measuring the phase offset of SE/STE signals.

Absent static magnetic field inhomogeneity, the phase is zero regardless of position; however, the phase is not zero and often exhibits position-dependent variation when static magnetic field inhomogeneity is present. This position-dependent variation of the phase enables measurement of the first-order phase offset $\Delta\Phi e$ of the SE/STE signals. Moreover, the zeroth-order phase offset $\phi0$ of the SE/STE signals can also be measured.

The function of the crushers Cs and Cƒ will now be described.

Figure 10:
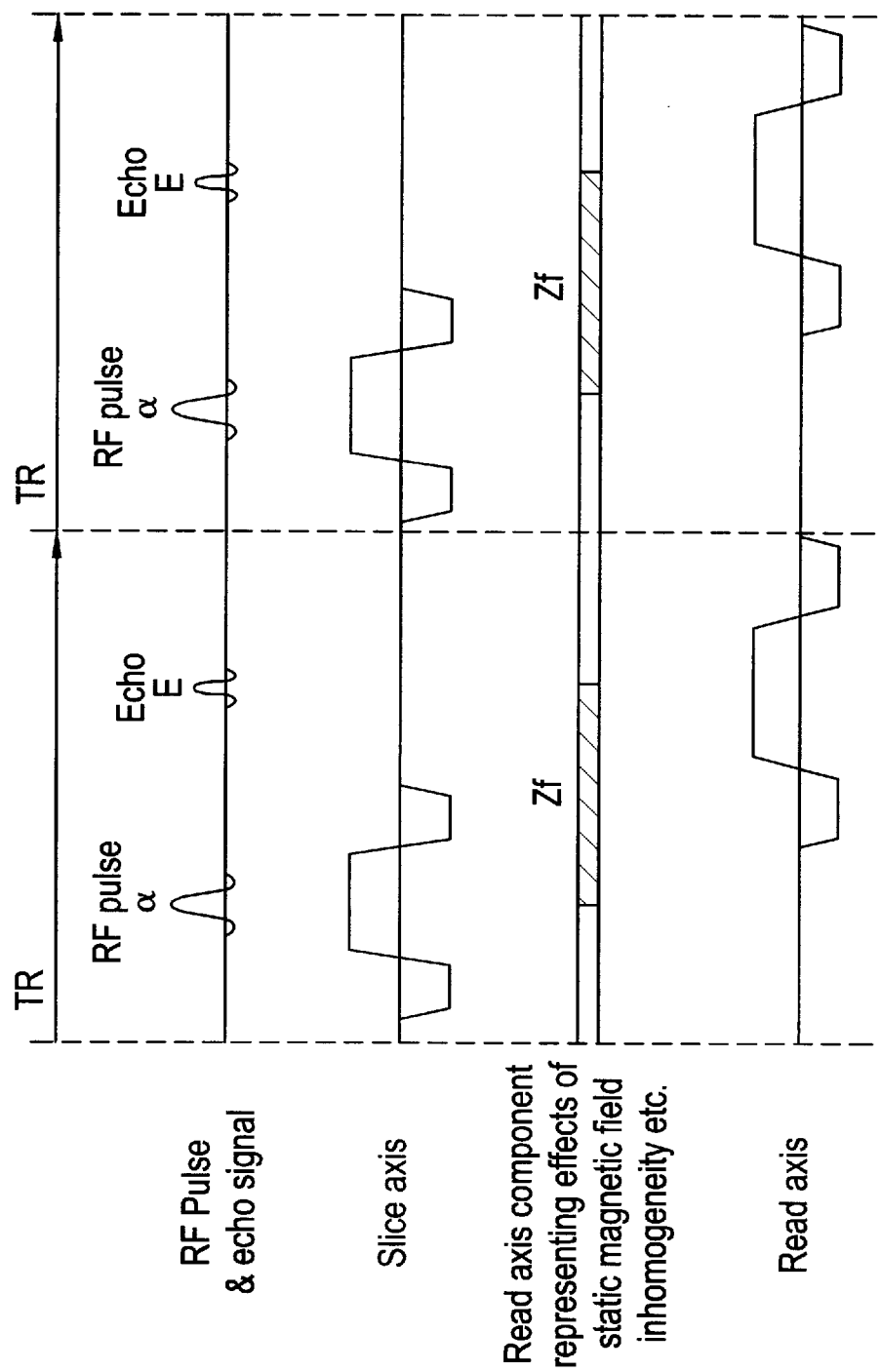
FIG. 10 is a schematic representation for explaining the phase offset of the FID signal.

FIG. 10 is a schematic representation for explaining the phase offset of the FID signal caused by static magnetic field inhomogeneity.

FIG. 10 represents effects of static magnetic field inhomogeneity, eddy currents, residual magnetization and the like as a constant magnetic field residing on the read axis. The phase offset of the FID signal results from an area Zƒ of the constant magnetic field integrated from the RF pulse α to the data collection period for each TR.

FIG. 11 is a schematic representation for explaining the phase offset of the SE/STE signals caused by static magnetic field inhomogeneity.

FIG. 11 represents effects of static magnetic field inhomogeneity, eddy currents, residual magnetization and the like as a constant magnetic field residing on the read axis. The phase offset of the SE/STE signals results from an area Ze of the constant magnetic field integrated from a second or further preceding RF pulse α with respect to a data collection period of interest to the data collection period of interest. (Because the effects of the same areas interposing an RF pulse α are canceled out, only the area Ze has an actual effect.)

Since the area of the crusher Cs shown in FIG. 2 is much larger than the area Ze in FIG. 11, the phase of the SE/STE signals is reset by the crusher Cs. Moreover, since the crusher Cs of FIG. 2 is applied after the data collection period, it has no effect on the phase of the FID signal.

On the other hand, since the area of the crusher Cƒ shown in FIG. 6 is much larger than the area Zƒ in FIG. 10, the phase of the FID signal is reset by the crusher Cƒ. Moreover, since each crusher Cƒ of FIG. 6 lies interposing the RF pulse α, it has no effect on the phase of the SE/STE signals. (The crushers are canceled out.)

The crushers Cs and Cƒ may be applied to both the phase encoding and read axes.

Figure 12A:
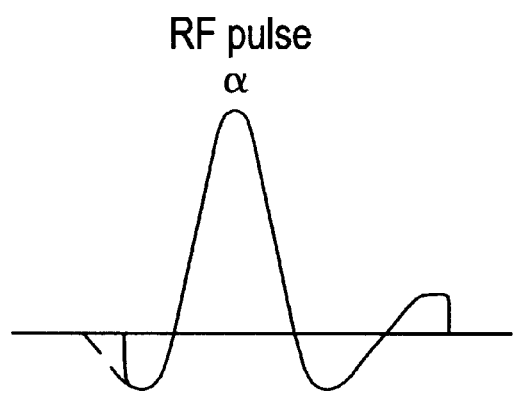
FIG. 12 is a schematic representation for explaining a method of correcting the phase offset.
Figure 12B:
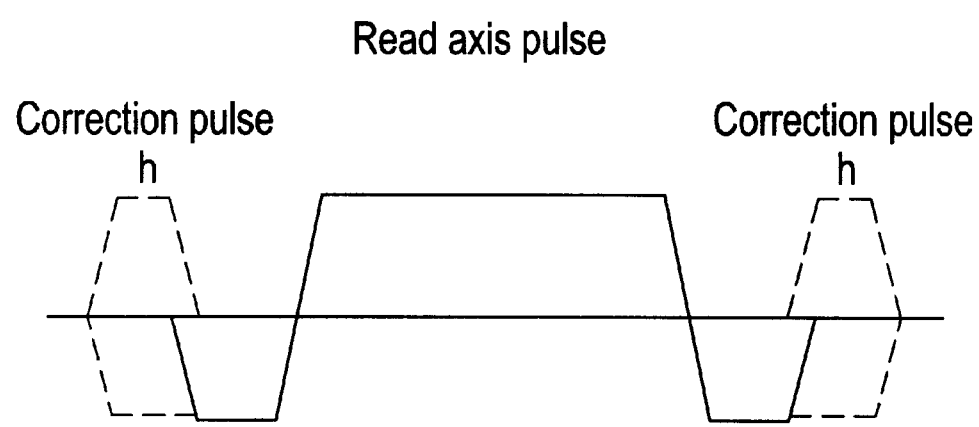

FIG. 12 is a conceptual representation showing a method of correcting the phase offsets.

As shown in (a), the zeroth-order phase offsets $\phi f0$ and $\phi e0$ of the FID signal and SE/STE signals can be corrected by adjusting the phase of the RF pulse α.

Moreover, as shown in (b), the first order phase offsets $\Delta\Phi f$ and $\Delta\Phi e$ of the FID signal and SE/STE signals can be corrected by incorporating correction pulses h into the read axis pulse.

The phase offset is re-measured using the phase-adjusted RF pulse α and the read axis pulse incorporating the correction pulses h, and the phase of the RF pulse α and the correction pulses are re-adjusted based on the resulting phase offset. The re-measurement and re-adjustment are repeated several times to optimize the correction.

Figure 13:
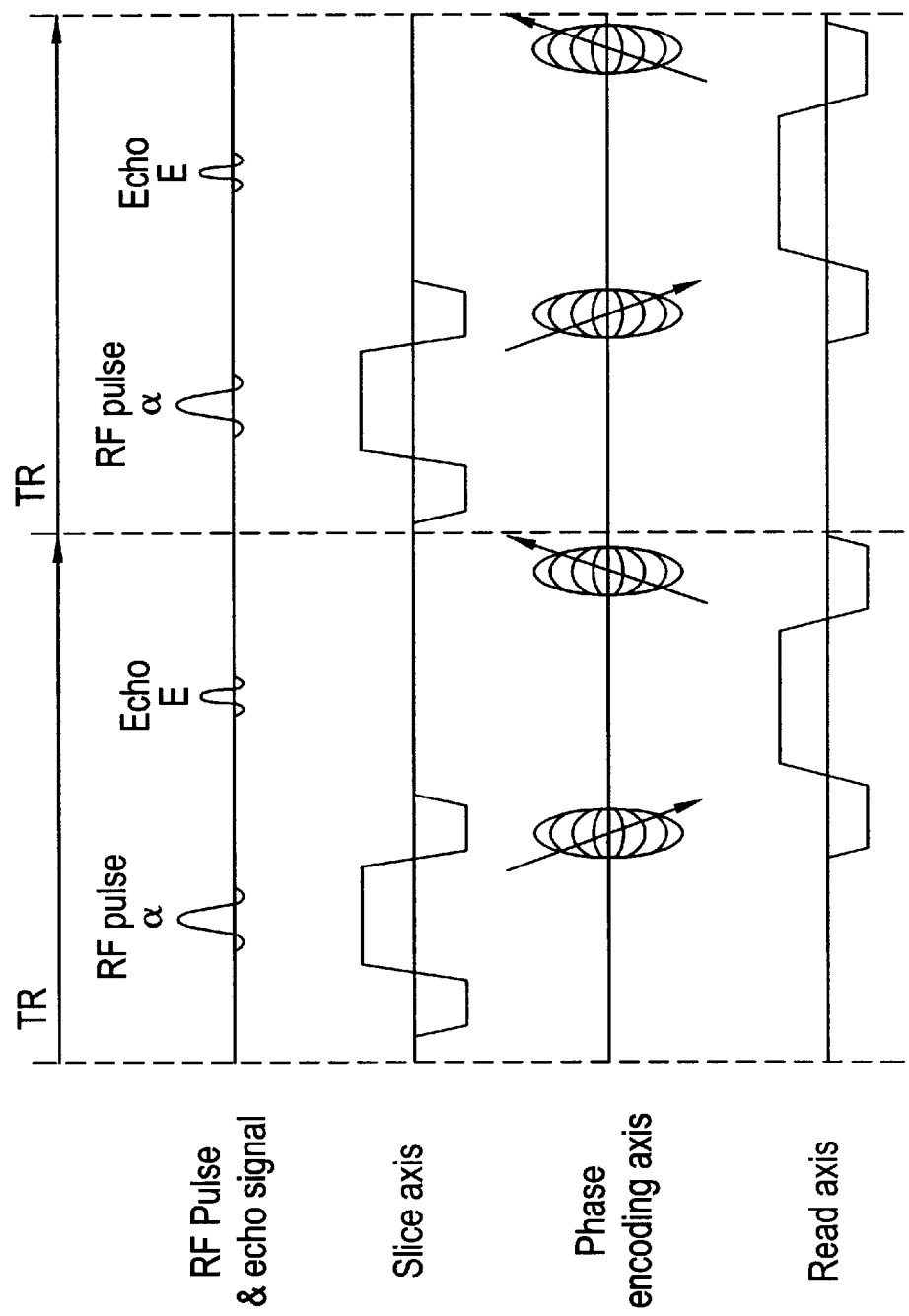
FIG. 13 is a pulse sequence chart showing an imaging pulse sequence.

FIG. 13 is a pulse sequence chart showing a pulse sequence that is repeated for collecting imaging data in the SSFP state.

The phase of the RF pulse α has been adjusted to correct the zeroth-order phase offset. Moreover, the correction pulses for correcting the first-order phase offset have been incorporated into the read axis pulse.

The phase encoding axis pulses (i.e. encoder and rewinder) are applied to the phase encoding axis.

When an image is produced from the imaging data collected with this pulse sequence, band artifacts can be reduced even if static magnetic field inhomogeneity is present.

According to the MRI apparatus 100, the following effects can be obtained:

(A) The phase offset of the FID signal caused by static magnetic field inhomogeneity can be measured;

(B) The phase offset of the SE/STE signals caused by static magnetic field inhomogeneity can be measured; and (C) The phase offset of the FID signal and the phase offset of the SE/STE signals caused by static magnetic field inhomogeneity can be corrected to reduce band artifacts in an image.

The present invention may also be applied to pulse sequences for conducting data collection in the SSFP state, for example, those of FIESTA (fast imaging employing steady state acquisition) and of True SFP. Moreover, the present invention can be applied to 3D versions of these pulse sequences. In addition, the present invention can be applied to these pulse sequence with flow correction.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:

a transmit coil for transmitting an RF pulse;

a gradient coil for applying a gradient magnetic field;

a receive coil for receiving an NMR signal;

a scanning device for driving said transmit coil, gradient coil and receive coil to collect data; and a data processing device for arithmetically processing the collected data to produce an image, wherein said scanning device adjusts the phase of an RF pulse in a pulse sequence that is repeated for conducting data collection in an SSFP state to correct the phase offsets of an FID signal and SE/STE signals, and collects imaging data in the SSFP state by repeating the resulting pulse sequence.

2. An MRI apparatus comprising:

a transmit coil for transmitting an RF pulse;

a gradient coil for applying a gradient magnetic field;

a receive coil for receiving an NMR signal;

a scanning device for driving said transmit coil, gradient coil and receive coil to collect data; and a data processing device for arithmetically processing the collected data to produce an image, wherein said scanning device adds a correction pulse for correcting the phase offsets of an FID signal and SE/STE signals to a pulse sequence that is repeated for conducting data collection in an SSFP state, and collects imaging data in the SSFP state by repeating the resulting pulse sequence.

3. An MRI apparatus comprising:

a transmit coil for transmitting an RF pulse;

gradient coil for applying a gradient magnetic field;

a receive coil for receiving an NMR signal, scanning device for driving said transmit coil, gradient coil and receive coil to collect data; and a data processing device for arithmetically processing the collected data to produce an image, wherein said scanning device adjusts the phase of an RF pulse in a pulse sequence that is repeated for conducting data collection in an SSFP state and adds a correction pulse for correcting the phase offsets of an FID signal and SE/STE signals to correct the phase offsets of the FID signal and SE/STE signals, and collects imaging data in the SSFP state by repeating the resulting pulse sequence.

4. The MRI apparatus of claim 1, wherein said correction pulse is incorporated into a read axis pulse.

5. The MRI apparatus of claim 3, wherein said correction pulse is incorporated into a read axis pulse.

* * * * *